(12) United States Patent
Wang et al.

(10) Patent No.: US 11,227,751 B1
(45) Date of Patent: Jan. 18, 2022

(54) PLASMA CHAMBER TARGET FOR REDUCING DEFECTS IN WORKPIECE DURING DIELECTRIC SPUTTERING

(71) Applicant: APPLIED MATERIALS, INC., Santa Clara, CA (US)

(72) Inventors: Xiaodong Wang, San Jose, CA (US); Jianxin Lei, Fremont, CA (US); Rongjun Wang, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/918,513

(22) Filed: Jul. 1, 2020

(51) Int. Cl.
*H01J 37/34* (2006.01)
*C23C 14/34* (2006.01)

(52) U.S. Cl.
CPC .......... *H01J 37/3435* (2013.01); *C23C 14/34* (2013.01)

(58) Field of Classification Search
CPC ....... C23C 14/54; C23C 14/081; C23C 14/14; C23C 14/185; C23C 14/3407; C23C 14/3464; H01J 37/3417; H01J 37/3426; H01J 37/3476; H01J 37/3447; H01J 37/3414
USPC ............................ 204/298.12, 298.13, 298.11
See application file for complete search history.

(56) References Cited

U.S. PATENT DOCUMENTS

| | | | |
|---|---|---|---|
| 4,450,062 A * | 5/1984 | Macaulay | C23C 14/564 204/192.3 |
| 6,024,852 A | 2/2000 | Tamura et al. | |
| 6,176,986 B1 | 1/2001 | Watanabe et al. | |
| 2003/0052000 A1 | 3/2003 | Segal et al. | |
| 2005/0199490 A1 | 9/2005 | Nomura et al. | |
| 2010/0133092 A1 | 6/2010 | Mashimo et al. | |
| 2010/0294657 A1 | 11/2010 | Nagano et al. | |
| 2012/0164354 A1 | 6/2012 | Otani et al. | |
| 2013/0168240 A1 | 7/2013 | Ogino | |
| 2014/0054167 A1 * | 2/2014 | Kajihara | C23C 14/3464 204/298.11 |
| 2014/0102889 A1 | 4/2014 | Kajihara et al. | |
| 2014/0284212 A1 | 9/2014 | Hisano et al. | |
| 2018/0291500 A1 | 10/2018 | Wang et al. | |

FOREIGN PATENT DOCUMENTS

| | | | |
|---|---|---|---|
| JP | 10-130827 A | | 5/1998 |
| JP | 2005-343758 | * | 12/2005 |
| JP | 2006-002208 | * | 1/2006 |
| JP | 2006-069811 | * | 3/2006 |
| WO | WO 2020/075750 | * | 4/2020 |

OTHER PUBLICATIONS

Machine Translation WO 2020/075750 (Year: 2020).*
Machine Translation JP 2006-002208 (Year: 2006).*

(Continued)

*Primary Examiner* — Rodney G McDonald
(74) *Attorney, Agent, or Firm* — Moser Taboada (57) ABSTRACT

Methods and apparatus for plasma chamber target for reducing defects in workpiece during dielectric sputtering are provided. For example, a dielectric sputter deposition target can comprise a dielectric compound having a predefined average grain size ranging from approximately 65 μm to 500 μm, wherein the dielectric compound is at least one of magnesium oxide or aluminum oxide.

20 Claims, 5 Drawing Sheets

(56) References Cited

OTHER PUBLICATIONS

Machine Translation JP 2006-069811 (Year: 2006).*
Machine Translation JP 2005-343758 (Year: 2005).*
International Search Report and Whiten Opinion dated Jul. 12, 2018 for PCT Application No. PCT/US2018/025011.
International Search Report for PCT/US2021/035607, dated Sep. 23, 2021.

* cited by examiner

TARGET GRAIN SIZE: 8um          DEFECTS: 218 > 40nm

FIG. 3

TARGET GRAIN SIZE: 30um          DEFECTS: 96 > 40nm

PLASMA CHAMBER TARGET FOR REDUCING DEFECTS IN WORKPIECE DURING DIELECTRIC SPUTTERING

FIELD

Embodiments of the present disclosure generally relate to substrate process chambers used in semiconductor manufacturing systems.

BACKGROUND

Sputtering, also known as physical vapor deposition (PVD), is a method of forming features in integrated circuits and is generally performed in a process chamber. Sputtering deposits a material layer such as a dielectric material on a workpiece (e.g., a substrate/substrate). A source material, such as a target, is bombarded by ions strongly accelerated by an electric field. The ion bombardment causes the material to be ejected from the target and causes the material to collect on, or be deposited upon, the substrate (e.g., the workpiece). During deposition, ejected particles may also be deposited upon other surfaces such as a shield or other inner surfaces of the process chamber.

The unwanted coating of the shield may cause defects to occur in the substrate being processed, or cause defects in subsequent substrate processing. Defects can occur, for example, when unwanted deposition occurs on the shield and a charge accumulates on the unwanted deposition causing arcing, or dielectric material collecting on the shield peels off.

Thus, the inventors have provided embodiments of an improved target for reducing defects during dielectric sputtering.

SUMMARY

Methods and apparatus for plasma chamber target for reducing defects in workpiece during dielectric sputtering are provided herein. For example, in some embodiments, an apparatus can include a dielectric sputter deposition target which can include a dielectric compound having a predefined average grain size ranging from approximately 65 µm to 500 µm, wherein the dielectric compound is at least one of magnesium oxide or aluminum oxide.

In at least some embodiments, a process chamber includes a chamber body defining an interior volume; a substrate support to support a substrate within the interior volume; and a plurality of targets to be sputtered onto the substrate including at least one dielectric target and at least one metallic target, wherein the dielectric target comprises a dielectric compound having a predefined average grain size ranging from approximately 65 µm to 500 µm.

In at least some embodiments, a method for performing physical vapor deposition in a process chamber can include selecting a first target in the process chamber and depositing a dielectric compound on a workpiece via the first target, wherein the dielectric compound has a predefined average grain size ranging from approximately 65 µm to 500 µm; and selecting a second target in the process chamber and depositing a metal over the dielectric compound on the workpiece via the second target.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Magnetic random access memory (MRAM) requires a barrier layer to be constructed as part of the memory device. The barrier layer must have high purity and low defect numbers to operate correctly. One of magnesium oxide (MgO) and/or aluminum oxide ($Al_2O_3$) are dielectric materials that can be utilized as a barrier layer. However, using RF power to deposit MgO on substrate surfaces inherently leads to poor defect performance.

Embodiments of a sputter deposition target comprising a dielectric compound with a predefined average grain size for reducing defects in a workpiece (e.g., a substrate) when fabricating MRAM are provided herein. As used herein, the grain size is an average grain size for the compound across the target, where the size itself has a wide distribution range. In some embodiments each grain is within 20% of the predefined grain size while in other embodiments each grain is within 30% of the average grain size (e.g., the predefined grain size). According to some embodiments at least 80%, or in other embodiments at least 90% of the grains in a target have a grain size within 20% or 30% of the preferred grain size. Preferred grain size range from approximately 20 µm, 40 µm, and 50 µm to 500 µm, even for pure single crystal. In another embodiment, at least 80% of the grains in a target have a grain size of at least 20 µm.

During physical vapor deposition of dielectric film on a substrate (e.g., substrate) in a processing chamber, a dielectric powder can also form on a shield in the processing chamber as the shield is closer to the target than the workpiece. Afterwards, when RF power is applied to the processing chamber, arcing may occur between the shield and the substrate due to the high concentration of positive ions on the shield, e.g., a sheath voltage. In other words, since dielectric film collects on the shield, and the dielectric film is not conductive, charge accumulates on the shield. The charge on the shield is not easily dissipated and causes arcing. Further, after multiple subsequent substrates are processed in the processing chamber, more dielectric film may build up on the shield and due to poor adhesion of the film to the shield, the film may flake or peel off and deposit on the substrate. The inventors have discovered that modifying the target grain size and the configuration of the targets and the shield has reduced defects in a workpiece by preventing arcing and preventing peeling of the dielectric film from the shield.

The inventors have observed that if a target comprising a dielectric compound (e.g., MgO, $Al_2O_3$) is used in a processing chamber, the majority of defects on the workpiece are dielectric particle defects. For example, the inventors observed that when a metal target (e.g., tantalum) was exposed in a processing chamber with a shield, the number of Ta defects was insignificant. However, when a dielectric target was exposed in the chamber, a significant number of defects were found on the workpiece in the form of dielectric particles. The source of the defects was verified by experimentation such as energy dispersive x-ray spectrometry (EDX), but other methods may also be used. The shield remained consistent, thus the defects were confirmed as originating from the dielectric target.

Figure 1:
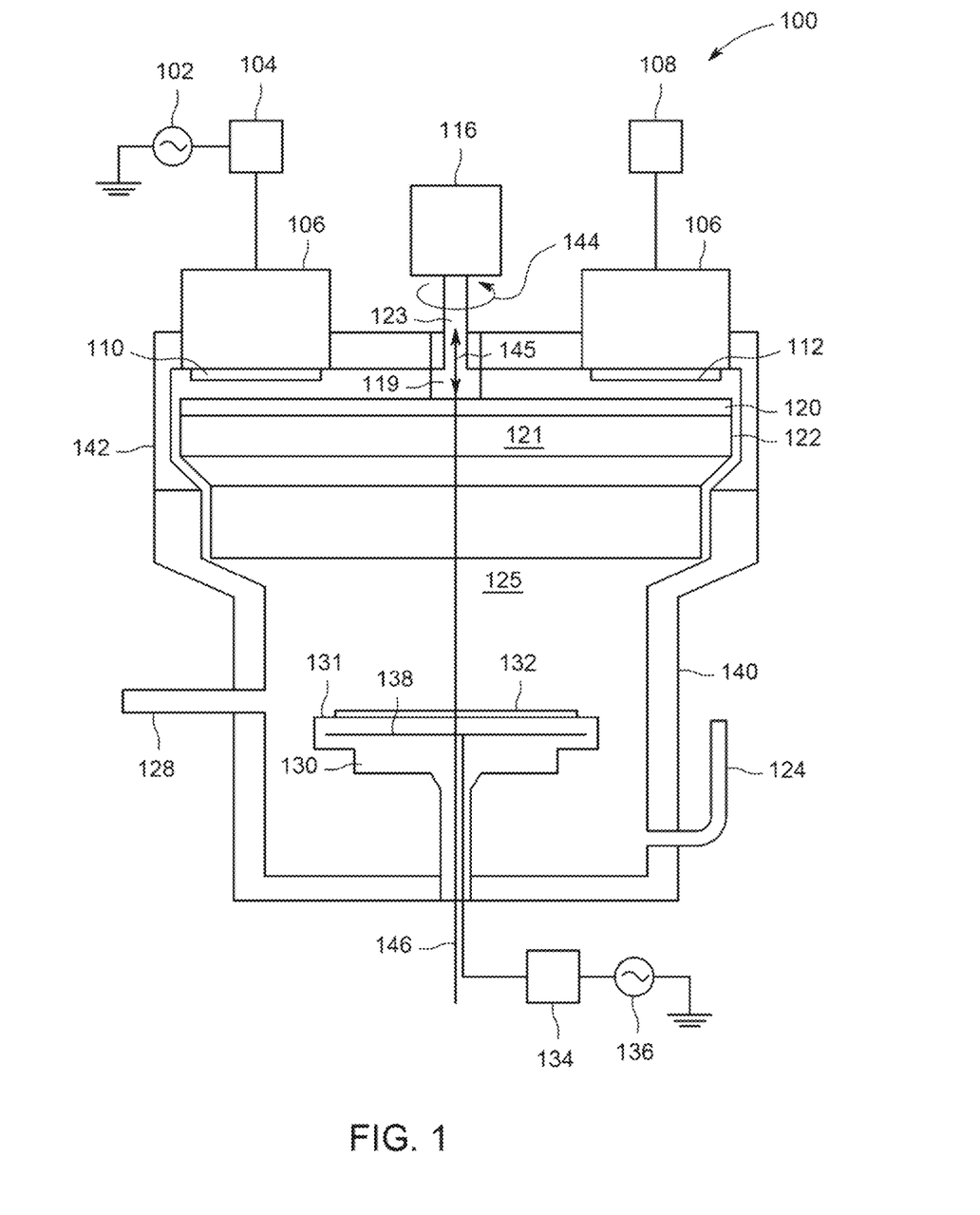
FIG. 1 depicts a schematic view of a multiple cathode processing chamber in accordance with exemplary embodiments described herein.

In some embodiments, a multiple cathode PVD chamber (e.g., process chamber 100) includes a plurality of cathodes 106 having a corresponding plurality of targets (at least one dielectric target 110 and at least one metal target 112), (for example, 6 cathodes in a 3 RF×3 DC alternating configuration) attached to a chamber body 140 (for example, via a top adapter assembly 142), which defines an interior volume. Other RF/DC cathode configurations can also be used such as 1×1, 2×2, 4×4, 5×5, etc. The numbers indicate a ratio of RF powered cathodes to DC powered cathodes. In some embodiments the RF and DC cathodes are alternated in the top adapter assembly 142. In other embodiments, an RF cathode can be adjacent to other RF cathodes and likewise for DC cathodes. In yet other embodiments the ratio of RF cathodes to DC cathodes can be a non-equal ratio such as 1×2, 2×1, 1×3, 3×1, 2×3, etc. When multiple RF cathodes are used, the operating frequencies may be offset to reduce any interference during deposition processes. For example, in a three RF cathode embodiment, the first RF cathode may be operated at a frequency of 13.56 MHz, the second RF cathode is operated at a frequency of 13.66 MHz (+100 kHz), and the third RF cathode is operated at a frequency of 13.46 MHz (−100 kHz). The offset can be chosen based on cross-talk prevention for a given number of cathodes.

An RF cathode is typically used with the dielectric target 110 for dielectric film deposition on a substrate. A DC cathode is typically used with the metallic target 112 for pasting after the dielectric film deposition on the substrate. The pasting reduces the chance of particle formation and defects in the deposition film. Having a process chamber with RF and DC cathodes allows for faster production of substrates because the pasting and dielectric deposition can be done in one chamber. In addition, having multiple cathodes of the same type, allows for greater pasting and deposition rates. A greater deposition rate means that a substrate spends less time in the chamber to achieve a certain film thickness. The reduced time in the chamber or dwell time reduction results in fewer substrate defects.

In some embodiments, the metallic target 112 may be formed of a metal such as, for example, tantalum, aluminum, titanium, molybdenum, tungsten, and/or magnesium. The dielectric target 110 may be formed of a metal oxide such as, for example, titanium oxide, titanium magnesium oxide, and/or tantalum magnesium oxide. Other metals and/or metal oxides, however, may alternatively be used.

The dielectric target 110 includes a dielectric compound which has a predefined grain size, and the grains are generally uniform across the dielectric target 110, with a small amount of variation in size for example 20-30%. The predefined grain size differs in different embodiments. In some embodiments, the grain size is selected from the range of approximately 20 µm to 500 µm. In some embodiments, at least 80%, or in some embodiments at least 90%, of the grains in a target have a grain size equal to the preferred grain size (e.g., 20 µm, 40 µm, 50 µm, and up to approximately 500 µm, or even larger).

Figure 3:
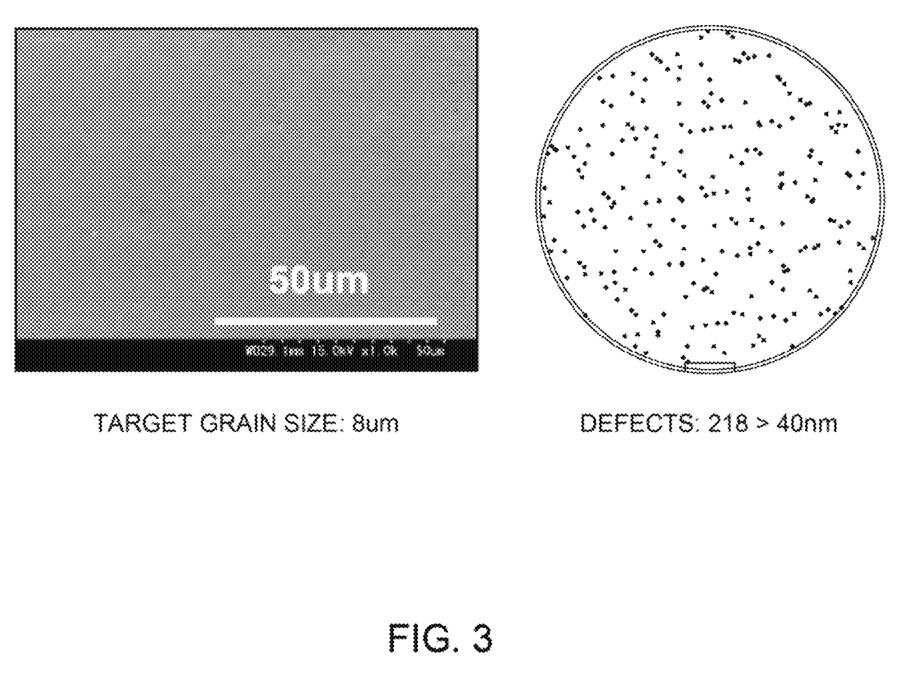
FIG. 3 is a magnified image of the target with a particular grain size.
Figure 4:
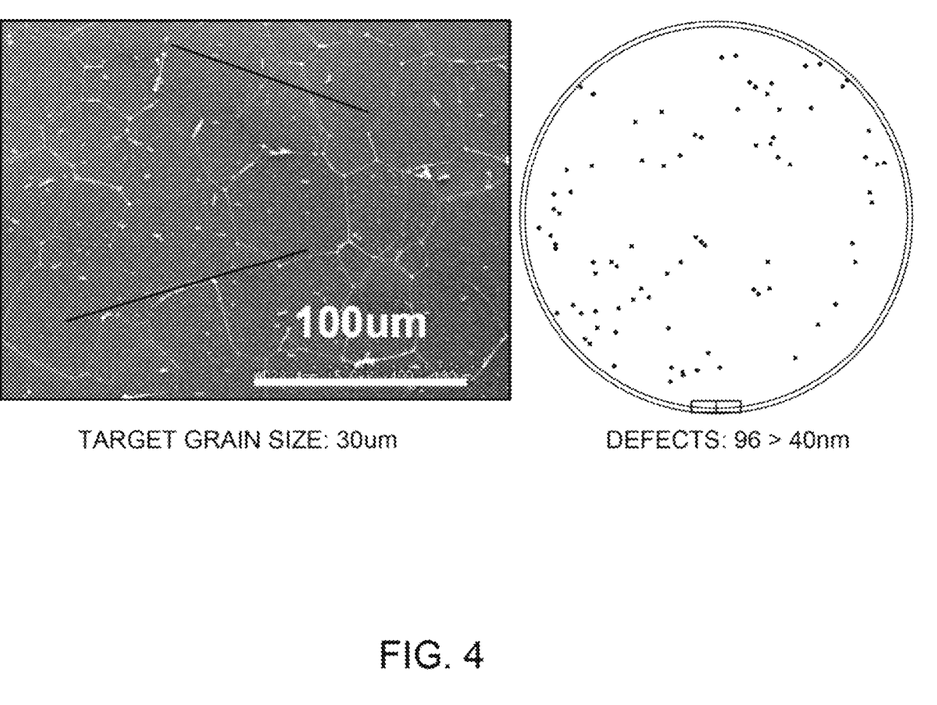
FIG. 4 is a magnified image of the target with a grain size in accordance with exemplary embodiments described herein.

FIG. 3 shows an example target having a grain size of 8 µm, where the substrate contains 218 defects of particle size greater than 40 nm. However, when the target grain size is increased to approximately 30 µm, as shown in FIG. 4, the number of particles (defects) is reduced to 96, for example. In some embodiments, the grain size is increased to approximately 40 µm where defects are estimated at approximately 50-60 particles in number, a significant reduction from 218 defects. Other embodiments have a target with grain size of approximately 80 µm, 120 µm, 400 µm, 500 µm, or even greater. While individual results for all of the grain sizes contemplated in the present embodiments are not shown, FIGS. 3 and 4 are illustrative of the reduction in particle defects on substrates obtained by reducing target grain size of dielectric target 110, for example. While some embodiments described herein are directed to the grain sizes indicated above, other grain sizes approximately equal or larger than 20 µm may also be used to reduce the number of defects on the substrate.

The number of particle defects is significantly reduced with the increase in grain size from 8 µm to at least 20 µm because there is a significant increase of surface area to volume with a larger grain size, while smaller grains have greater ratios of surface area to volume. The increase in grain size reduces the particle boundary region, as can be seen in FIG. 4. Since the grain size is larger, the grain boundary area is smaller and causes fewer defects. In other embodiments, the finish of the dielectric target 110 is modified. For example, the target may have a sputtering surface that has a surface roughness that ranges from approximately 6 µm surface roughness to a polished surface with a mirror finish (approximately no surface roughness). The inventors have discovered that the closer to a mirror finish that is achieved, the fewer particles detected on the workpiece. In some embodiments the dielectric target 110 has a density of at least 99.7% of pure single crystal MgO or, in some instances, at least 99.98% of pure single crystal MgO to reduce defects in the workpiece. As used herein, target density refers to the percentage that the target is to a theoretical pure single crystal density that could theoretically be provided.

The process chamber 100 also includes a substrate support 130 to support a substrate 132. The process chamber 100 includes an opening (not shown) (e.g., a slit valve) through which an end effector (not shown) may extend to place the substrate 132 onto lift pins (not shown) for lowering the substrate 132 onto a support surface 131 of the substrate support 130. In the embodiment shown in FIG. 1, the dielectric target 110 and the metallic target 112 are disposed substantially parallel with respect to the support surface 131. The substrate support 130 includes a biasing source 136 coupled to a bias electrode 138 disposed in the substrate support 130 via a matching network 134. The top adapter assembly 142 is coupled to an upper portion of the chamber body 140 of the process chamber 100 and is grounded. Each cathode 106 can have a DC power source 108 or an RF power source 102 and an associated magnetron. In the case of the RF power source 102, the RF power source 102 is coupled to a cathode 106 via an RF matching network 104.

A shield 121 is rotatably coupled to the top adapter assembly 142 and is shared by the cathodes 106. In some embodiments, the shield 121 includes a shield body 122 and a shield top 120. In other embodiments, the shield 121 has aspects of both the shield body 122 and the shield top 120 integrated into one unitary piece. In yet other embodiments, the shield 121 can be more than a two pieces. Depending on the number of targets that need to be sputtered at the same time, the shield 121 can have one or more holes to expose a corresponding one or more targets. The shield 121 advantageously limits or eliminates cross-contamination between the plurality of targets, including dielectric target 110 and metallic target 112. The shield 121 is rotationally coupled to the top adapter assembly 142 via a shaft 123. The shaft 123 is attached to the shield 121 via a coupler 119. Additionally, since the shield 121 is rotatable, areas of the shield 121 that would not normally receive pasting are moved such that the areas can now be pasted, significantly reducing flaking of built-up deposition and particle formation. The process chamber 100 may also comprise at least one shunt disposed in a topside of the shield 121 to accommodate and shield at least another one of the plurality of targets not to be sputtered.

An actuator 116 is coupled to the shaft 123 opposite the shield 121. The actuator 116 is configured to rotate the shield 121, as indicated by arrow 144, and move the shield 121 up and down in the vertical direction along the central axis 146 of the process chamber 100, as indicated by arrow 145. During processing, the shield 121 is raised to an upward position. The raised position of the shield 121 exposes targets used during processing and also shields targets not used during processing. The raised position also grounds the shield for RF processing.

In some embodiments, the process chamber 100 further includes a process gas supply 128 to supply a process gas to an interior volume 125 of the process chamber 100. The process chamber 100 may also include an exhaust pump 124 fluidly coupled to the interior volume 125 to exhaust the process gas from the process chamber 100. In some embodiments, for example, the process gas supply 128 may supply oxygen to the interior volume 125 after the metallic target 112 has been sputtered.

Figure 2:
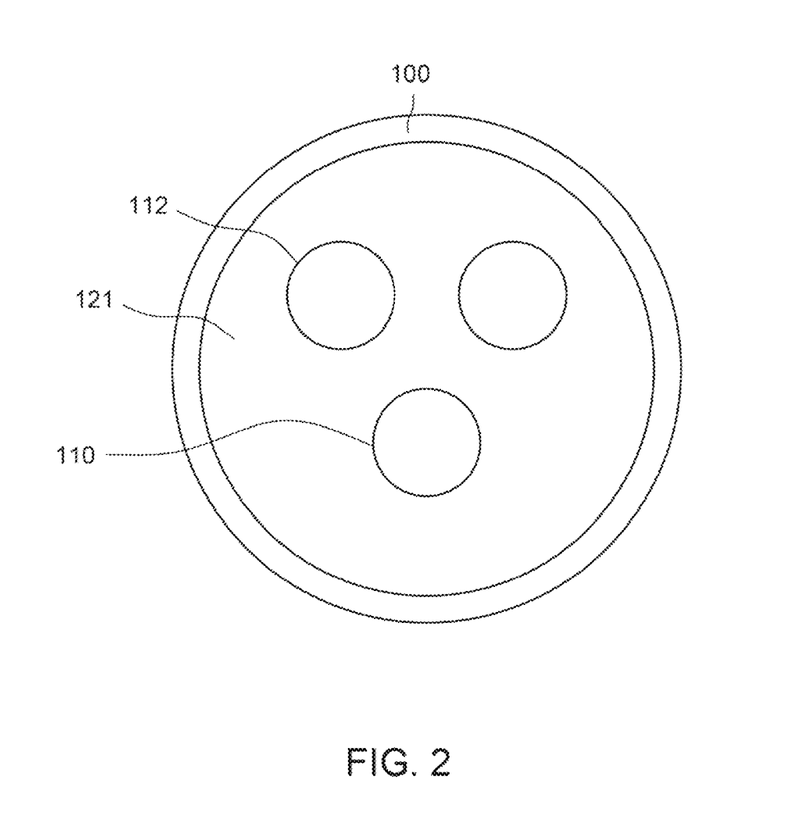
FIG. 2 is an illustration of the spatial configuration of the chamber in FIG. 1 in accordance with exemplary embodiments described herein.

FIG. 2 is an illustration of the spatial configuration of the process chamber 100 in FIG. 1 in accordance with exemplary embodiments described herein.

According to some embodiments, the dielectric target 110 and the metallic target 112 (along with any other targets) are disposed away from the edge of the shield 121, typically approximately 0.5 inches to 2.0 inches away from the edges of the shield 121. When targets are disposed at the edges of a shield, the film that is deposited there tends to be more stressed than other areas and causes particles to flake and deposit on the workpiece. As the targets are disposed towards the center of the shield 121, the amount of stress on the films is significantly reduced as there is less concentration of film in narrow areas, leading to a reduction in flaking and particle defects depositing on the workpiece.

Figure 5:
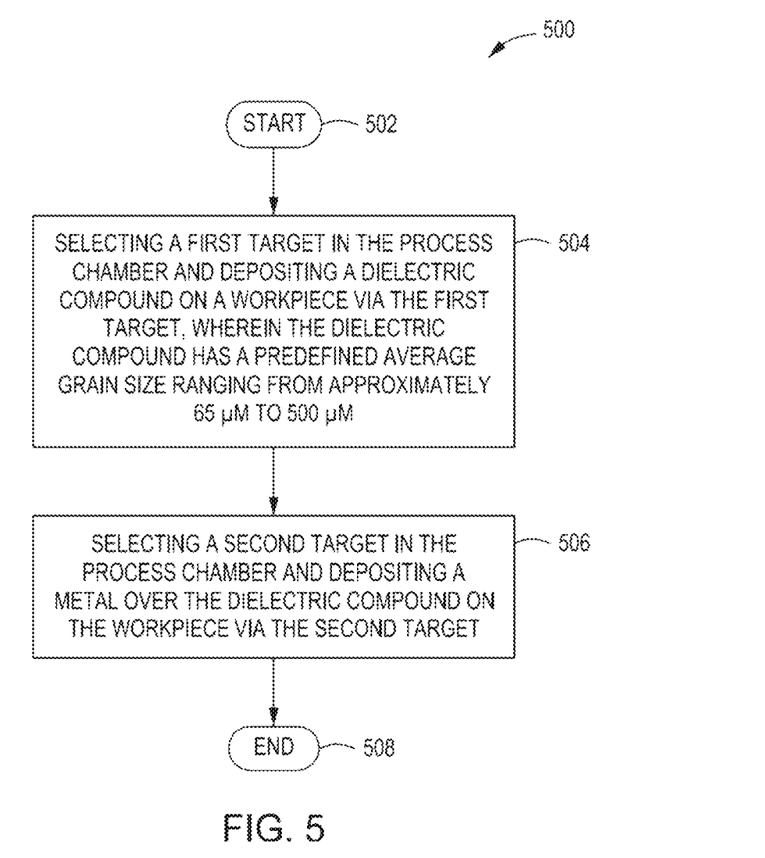
FIG. 5 depicts a flow diagram for a method for reducing defects on a workpiece in accordance with exemplary embodiments described herein.

FIG. 5 depicts a flow diagram for a method 500 for depositing a film on a substrate in accordance with exemplary embodiments described herein.

The method 500 begins at 502 and proceeds to 504. At 504, a first target i selected in the process chamber 100 and a dielectric compound (e.g., MgO, $Al_2O_3$) is deposited on a workpiece (e.g., a semiconductor substrate) via a first dielectric target. For example, in at least some embodiments, the dielectric compound can be a single crystal target having a diameter from about two inches to about six inches. The predefined grain size differs in different embodiments. For example, in some embodiments, the predefined grain size is selected from the range of approximately 20 μm to 500 μm. In some embodiments the predefined grain size can be about 65 μm to about 500 μm. In some embodiments, at least 80%, or in some embodiments at least 90%, of the grains in a target have a grain size equal to the preferred grain size (e.g., 20 μm, 40 μm, 50 μm, 400 μm, 500 μm, or even greater).

Next at 506, a second target is selected in the process chamber 100 and a second metal is deposited over the dielectric material on the workpiece via the second target. The second target is generally a metal target and the metal can be, for example, tantalum.

Thereafter, the process chamber 100 prepares for the next or subsequent workpiece and the method 500 ends at 508.

While the foregoing is directed to embodiments of the present disclosure, other and further embodiments of the disclosure may be devised without departing from the basic scope thereof.

The invention claimed is:

1. A dielectric sputter deposition target, consisting essentially of:
   a dielectric compound having a predefined average grain size ranging from greater than 400 μm to about 500 μm,
   wherein the dielectric compound is at least one of magnesium oxide or aluminum oxide, and
   wherein at least 90% of the grains in the dielectric compound have a grain size equal to the predefined average grain size.

2. The dielectric sputter deposition target of claim 1, wherein at least 90% of grains of the dielectric compound have a size within one of 20% of the predefined average grain size, or within 30% of the predefined average grain size.

3. The dielectric sputter deposition target of claim 1, wherein the dielectric compound is a single crystal.

4. The dielectric sputter deposition target of claim 1, wherein the dielectric compound has a density of at least 99.7%.

5. The dielectric sputter deposition target of claim 1, wherein the dielectric compound has a density of at least 99.98%.

6. A process chamber, comprising:
   a chamber body defining an interior volume;
   a substrate support to support a substrate within the interior volume; and
   a plurality of targets to be sputtered onto the substrate including at least one dielectric target and at least one metallic target, wherein the dielectric target comprises a dielectric compound having a predefined average grain size ranging from greater than 400 μm to about 500 μm,
   wherein at least 90% of the grains in the dielectric compound have a grain size equal to the predefined average grain size.

7. The process chamber of claim 6, wherein the dielectric compound is a single crystal.

8. The process chamber of claim 6, further comprising:
   a plurality of cathodes coupled to the chamber body and corresponding to the plurality of targets.

9. The process chamber of claim 6, further comprising a shield coupled to the chamber body and having at least one hole to expose at least one of the plurality of targets to be sputtered, wherein the plurality of targets are disposed at least 0.5 inches away from an edge of the shield.

10. The process chamber of claim 9, wherein, the shield is rotatably coupled to an upper portion of the chamber body.

11. The process chamber of claim 9, wherein the shield further comprises:
   at least one shunt disposed in a topside of the shield to accommodate and shield at least another one of the plurality of targets not to be sputtered.

12. The process chamber of claim 9, wherein the shield is configured to rotate about and linearly move along a central axis of the process chamber.

13. A method for performing physical vapor deposition in a process chamber, the method comprising:
   selecting a first target in the process chamber and depositing a dielectric compound on a workpiece via the first target, wherein the dielectric compound has a predefined average grain size ranging from greater than 400 µm to about 500 µm, wherein at least 90% of the grains in the dielectric compound have a grain size equal to the predefined average grain size; and
   selecting a second target in the process chamber and depositing a metal over the dielectric compound on the workpiece via the second target.

14. The method of claim 13, wherein the first target is a dielectric target and the second target is a metal target.

15. The method of claim 13, wherein the metal is tantalum.

16. The method of claim 13, wherein the first target is disposed approximately 0.5 inches to 2.0 inches away from an edge of a shield of the process chamber.

17. The method of claim 13, wherein the first target has a mirror finish.

18. The dielectric sputter deposition target of claim 1, wherein the dielectric compound has a predefined average grain size ranging from about 450 µm to about 500 µm.

19. The process chamber of claim 6, wherein the dielectric compound has a predefined average grain size ranging from about 450 µm to about 500 µm.

20. The method of claim 13, wherein the dielectric compound has a predefined average grain size ranging from about 450 µm to about 500 µm.

* * * * *